(12) United States Patent
Lee et al.

(10) Patent No.: US 9,172,064 B2
(45) Date of Patent: Oct. 27, 2015

(54) MASK FOR DEPOSITION AND METHOD FOR MANUFACTURING ORGANIC LIGHT EMITTING DIODE DISPLAY USING THE SAME

(71) Applicant: SAMSUNG DISPLAY CO., LTD., Yongin, Gyeonggi-Do (KR)

(72) Inventors: Jung-Min Lee, Yongin (KR); Choong-Ho Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 108 days.

(21) Appl. No.: 13/899,531

(22) Filed: May 21, 2013

(65) Prior Publication Data

US 2013/0337588 A1   Dec. 19, 2013

(30) Foreign Application Priority Data

Jun. 13, 2012 (KR) .................. 10-2012-0063224

(51) Int. Cl.
*H01L 51/56* (2006.01)
*H01L 51/00* (2006.01)
*C23C 14/04* (2006.01)
*H01L 51/50* (2006.01)

(52) U.S. Cl.
CPC .............. *H01L 51/56* (2013.01); *C23C 14/042* (2013.01); *H01L 51/0011* (2013.01)

(58) Field of Classification Search
CPC ........... G03F 7/164; G03F 1/36; C23C 14/12; C23C 14/225; B05C 21/005; H01L 51/0002; H01L 51/0011; H01L 27/3283; H01L 51/56

USPC .............................................. 378/35; 118/504
See application file for complete search history.

(56) References Cited

U.S. PATENT DOCUMENTS

| 7,314,771 B2 * | 1/2008 | Lee et al. .................. 438/34 |
| 7,677,942 B2 * | 3/2010 | Shin et al. ................. 445/24 |
| 7,808,177 B2 * | 10/2010 | Ha et al. .................. 313/506 |
| 2002/0076847 A1 * | 6/2002 | Yamada et al. ........... 438/34 |
| 2002/0111035 A1 * | 8/2002 | Atobe et al. ............. 438/753 |
| 2003/0015698 A1 * | 1/2003 | Baldo et al. .............. 257/40 |
| 2004/0123804 A1 * | 7/2004 | Yamazaki et al. ...... 118/723 VE |

(Continued)

FOREIGN PATENT DOCUMENTS

JP   2003-045657 A        2/2003
JP   2003045657 A   *    2/2003   ............ H05B 33/10

(Continued)

*Primary Examiner* — Laura Menz
*Assistant Examiner* — Maliheh Malek
(74) *Attorney, Agent, or Firm* — Christie, Parker & Hale, LLP (57) ABSTRACT

A deposition mask for forming an organic layer pattern of an organic light emitting diode (OLED) display includes a base member having a first surface facing a substrate of the OLED display, and a second surface facing a side opposite to the first surface, and including a plurality of openings passing through the first surface and the second surface for forming the organic layer pattern. The opening has a pair of first side walls and a pair of second side walls. Each side wall of the openings has an inclination surface inclined with respect to a thickness direction of the base member, and when measuring an inclination angle of the inclination surface with reference to the first surface of the base member, the inclination angle of the first side wall and the inclination angle of the second side wall are different from each other.

12 Claims, 7 Drawing Sheets

(56) References Cited

U.S. PATENT DOCUMENTS

| | | | |
|---|---|---|---|
| 2005/0001546 A1* | 1/2005 | Yamaguchi | 313/512 |
| 2005/0136668 A1* | 6/2005 | Yotsuya | 438/689 |
| 2006/0154407 A1* | 7/2006 | Han et al. | 438/149 |
| 2007/0178708 A1* | 8/2007 | Ukigaya | 438/758 |
| 2008/0018236 A1* | 1/2008 | Arai et al. | 313/504 |
| 2008/0115729 A1* | 5/2008 | Oda et al. | 118/726 |
| 2008/0268135 A1* | 10/2008 | Yokoyama et al. | 427/64 |
| 2009/0017192 A1* | 1/2009 | Matsuura | 427/66 |
| 2010/0297349 A1* | 11/2010 | Lee et al. | 427/248.1 |
| 2010/0330712 A1* | 12/2010 | Lee et al. | 438/22 |
| 2011/0088622 A1* | 4/2011 | Choi et al. | 118/720 |
| 2011/0129956 A1* | 6/2011 | Polito et al. | 438/71 |
| 2011/0165327 A1* | 7/2011 | Park et al. | 427/248.1 |
| 2011/0220019 A1* | 9/2011 | Lee et al. | 118/504 |
| 2011/0293819 A1* | 12/2011 | Lee et al. | 427/66 |
| 2012/0091482 A1* | 4/2012 | Uchida et al. | 257/88 |
| 2012/0100644 A1* | 4/2012 | Prushinskiy et al. | 438/22 |
| 2012/0268430 A1* | 10/2012 | Tao et al. | 345/204 |
| 2013/0134451 A1* | 5/2013 | Lee | 257/88 |
| 2013/0337597 A1* | 12/2013 | Kawato et al. | 438/34 |

FOREIGN PATENT DOCUMENTS

| | | |
|---|---|---|
| KR | 10-2006-0109627 | 10/2006 |
| KR | 10-2006-0109627 A | 10/2006 |
| KR | 10-2007-0042641 A | 4/2007 |
| KR | 10-2009-0090545 A | 8/2009 |
| KR | 10-2011-0019966 A | 3/2011 |
| KR | 10-2011-0090200 A | 8/2011 |

\* cited by examiner

MASK FOR DEPOSITION AND METHOD FOR MANUFACTURING ORGANIC LIGHT EMITTING DIODE DISPLAY USING THE SAME

CROSS-REFERENCE TO RELATED APPLICATION

This application claims priority to and the benefit of Korean Patent Application No. 10-2012-0063224 filed in the Korean Intellectual Property Office on Jun. 13, 2012, the entire content of which is incorporated herein by reference.

BACKGROUND

1. Field

The described technology relates generally to a mask for thin film deposition and a manufacturing method of an organic light emitting diode (OLED) display.

2. Description of the Related Art

An organic light emitting diode (OLED) display includes a hole injection electrode, an electron injection electrode, and an organic emission layer formed therebetween, and the display emits light as holes injected from an anode and electrons injected from a cathode are recombined to form excitons at the organic light emission layer. The organic light emitting diode (OLED) display device, having high quality properties such as low power consumption, high luminance, a wide viewing angle, a high reaction speed, and the like, is receiving much attention as a next-generation display device for mobile electronic devices.

The organic light emitting diode (OLED) display includes an organic light emitting display panel including a display substrate on which thin film transistors and organic light emitting diodes (OLED) are formed. The organic light emitting diode includes an anode, a cathode, and an organic emission layer. Holes and electrons are injected from the anode and the cathode, respectively, to form excitons, and the excitons make a transition to a ground state, thereby causing the organic light emitting diode to emit light.

In a flat panel display such as the organic light emitting diode (OLED) display, a vacuum deposition method is used for depositing an organic material or metal used as the electrode in a vacuum atmosphere and forming a thin film on a flat plate. In the vacuum deposition method, a substrate on which an organic thin film will be formed is positioned in a vacuum chamber, and an organic material is evaporated or sublimated by using a deposition source unit to deposit it on the substrate.

A deposition mask is used to form an organic layer of a desired shape on the substrate. When an organic material is deposited on a large-sized substrate, a fine metal mask (FMM) may be used as the deposition mask. Since the FMM is a high-definition metal mask having high durability and strength, the organic material can be deposited on the large-sized substrate in a desired pattern.

The FMM may be a deposition mask for depositing an organic material on a large-sized substrate in a high-definition pattern. Using the FMM, a plurality of desired high-definition patterns of organic material can be formed on the substrate all at the same time or concurrently. To deposit the organic material in the desired pattern, the high-definition metal mask may include a plurality of square-shaped slits or a plurality of stripe-shaped slits for allowing the organic material to pass through the FMM. Here, the plurality of square-shaped slits or the plurality of stripe-shaped slits may form a unit masking part, and a plurality of unit masking parts may be provided. A deposition technique using the high-definition metal mask may be used in an organic material deposition and cathode formation process to manufacture the large-sized organic electro-luminescence display device.

To increase the resolution of the organic light emitting diode (OLED) display, the pitch of subpixels of red (R), green (G), and blue (B) are reduced, and to reduce the pitch, an interval between the slots formed in the deposition mask are reduced. However, if the interval within the mask pattern is decreased, a bridge portion of the mask supporting a portion between the slots becomes weak and may be easily broken. Accordingly, it is difficult to manufacture a deposition mask having a high resolution of more than 300 ppi (pixels per inch).

The above information disclosed in this Background section is only for enhancement of understanding of the background of the described technology and therefore may contain information that does not form the prior art that is already known in this country to a person of ordinary skill in the art.

SUMMARY

Embodiments of the present invention provide a deposition mask realizing high resolution by reducing a deposition margin of an organic material, and a manufacturing method of an organic light emitting diode (OLED) display.

Also, embodiments of the present invention provide a deposition mask that reduces a shadow where the organic material is penetrated between the deposition mask and the substrate, and a manufacturing method of an organic light emitting diode (OLED) display.

A deposition mask for forming an organic layer pattern of an organic light emitting diode (OLED) display according to an embodiment of the present invention includes a base member having a first surface facing a substrate of the OLED display, and a second surface facing a side opposite to the first surface, and including a plurality of openings passing through the first surface and the second surface for forming the organic layer pattern. Each of the openings has a pair of first side walls facing each other in a first direction and a pair of second side walls facing each other in a second direction crossing the first direction, each side wall of the first side walls and the second side walls has an inclination surface inclined with respect to a thickness direction of the base member, and when measuring an inclination angle of the inclination surface with reference to the first surface of the base member, the inclination angle of the first side wall and the inclination angle of the second side wall are different from each other.

The inclination angle of the first side wall may be larger than the inclination angle of the second side wall.

The inclination angle of the first side wall may be between about 45 degrees and about 60 degrees, and the inclination angle of the second side wall may be between about 25 degrees and about 34 degrees.

The base member may include a first bridge part including the first side wall and formed between the adjacent openings in the first direction, and a second bridge part including the second side wall and formed between the adjacent openings in the second direction, and the height of the first bridge part and the height of the second bridge part may be different from each other.

The height of the first bridge part may be substantially the same as the thickness of the base member, and the height of the second bridge part may be less than the thickness of the base member.

The openings may be arranged with a matrix format having rows in the first direction and columns in the second direction.

A manufacturing method of an organic light emitting diode (OLED) display according to an embodiment of the present invention includes disposing a substrate of the OLED display to face a deposition source for spraying an organic material; disposing a deposition mask on the substrate, the deposition mask including a base member having a first surface facing a substrate and a second surface facing a side opposite to the first surface, the base member including a plurality of openings passing through the first surface and the second surface for forming the organic layer pattern, wherein each of the openings has a pair of first side walls facing each other in a first direction and a pair of second side walls facing each other in a second direction crossing the first direction, each side wall of the first side walls and the second side walls has an inclination surface that is inclined with respect to a thickness direction of the base member, and wherein an inclination angle of the inclination surface is measured with reference to the first surface of the base member, and the inclination angle of the first side wall and the inclination angle of the second side wall are different from each other; and forming the organic layer pattern on the substrate by spraying the organic material from a deposition source.

In the deposition mask, the inclination angle of the first side wall may be larger than the inclination angle of the second side wall.

The deposition source includes a linear deposition source including a plurality of spray nozzles arranged in a direction parallel to the second direction, and the deposition source sprays the organic material while being moved in the first direction.

The inclination angle of the second side wall may be smaller than a minimum angle among angles formed by an incident direction of the organic material sprayed from a plurality of spray nozzles and the substrate.

In the deposition mask, the inclination angle of the first side wall may be between about 45 degrees and about 60 degrees, and the inclination angle of the second side wall may be between about 25 degrees and about 34 degrees.

According to the exemplary embodiments, the deposition margin of the organic material is reduced, and the aperture ratio of the organic light emitting diode (OLED) display is increased, thereby realizing high resolution.

Also, according to the exemplary embodiments, a shadow where the organic material is penetrated between the deposition mask and the substrate may be reduced such that a uniform organic thin film may be formed.

DETAILED DESCRIPTION

A deposition mask and a method for manufacturing an organic light emitting diode (OLED) display according to embodiments of the present invention will be described with reference to the accompanying drawings. However, the present invention is not limited to the exemplary embodiments disclosed hereinafter, but may be implemented in various different forms. The exemplary embodiments herein merely complete the disclosure of the present invention and fully provide explanation of the invention to the ordinarily skilled person in the art. Like reference numerals refer to like elements.

In the drawings, the thickness of layers, films, panels, regions, etc., may be exaggerated for clarity. In the drawings, for better understanding and ease of description, the thicknesses of some layers and areas may be exaggerated. It will be understood that when an element such as a layer, film, region, or substrate is referred to as being "on" another element, it can be directly on the other element, or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element, and does not imply being necessarily positioned on the top on the basis of a gravity direction.

Figure 1:
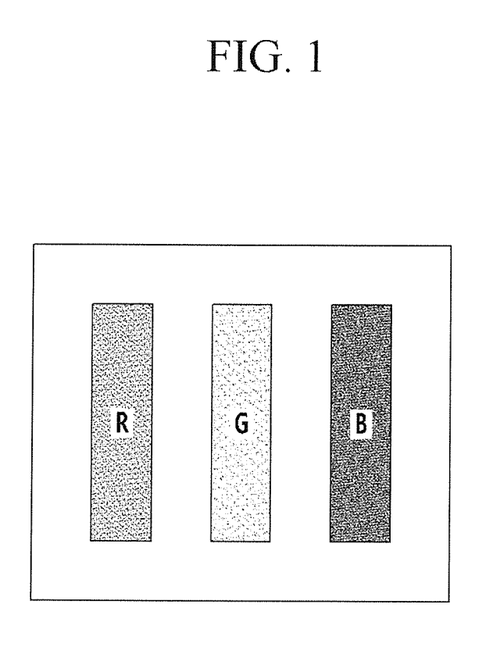
FIG. 1 is a schematic view of a unit pixel of an organic light emitting diode (OLED) display manufactured by using a deposition mask according to an exemplary embodiment.

FIG. 1 is a schematic view of a unit pixel of an organic light emitting diode (OLED) display manufactured by using a deposition mask according to an exemplary embodiment.

A unit pixel of an organic light emitting diode (OLED) display manufactured by using a deposition mask according to an exemplary embodiment includes subpixels formed with an organic emission layer respectively emitting light with red (R), green (G), and blue (B) colors, as shown in FIG. 1. Here, a subpixel peripheral area is an area where the organic material forming the organic emission layer is deposited, no light is emitted in this area although the organic material is deposited, and the organic emission layer is formed with a set or predetermined thickness for emitting the desired light. It is because an opening of the deposition mask is actually formed larger than a light emitting area. A difference between the size of the actual light emitting area and the size of the opening of the deposition mask is referred to as a deposition margin.

Figure 2A:
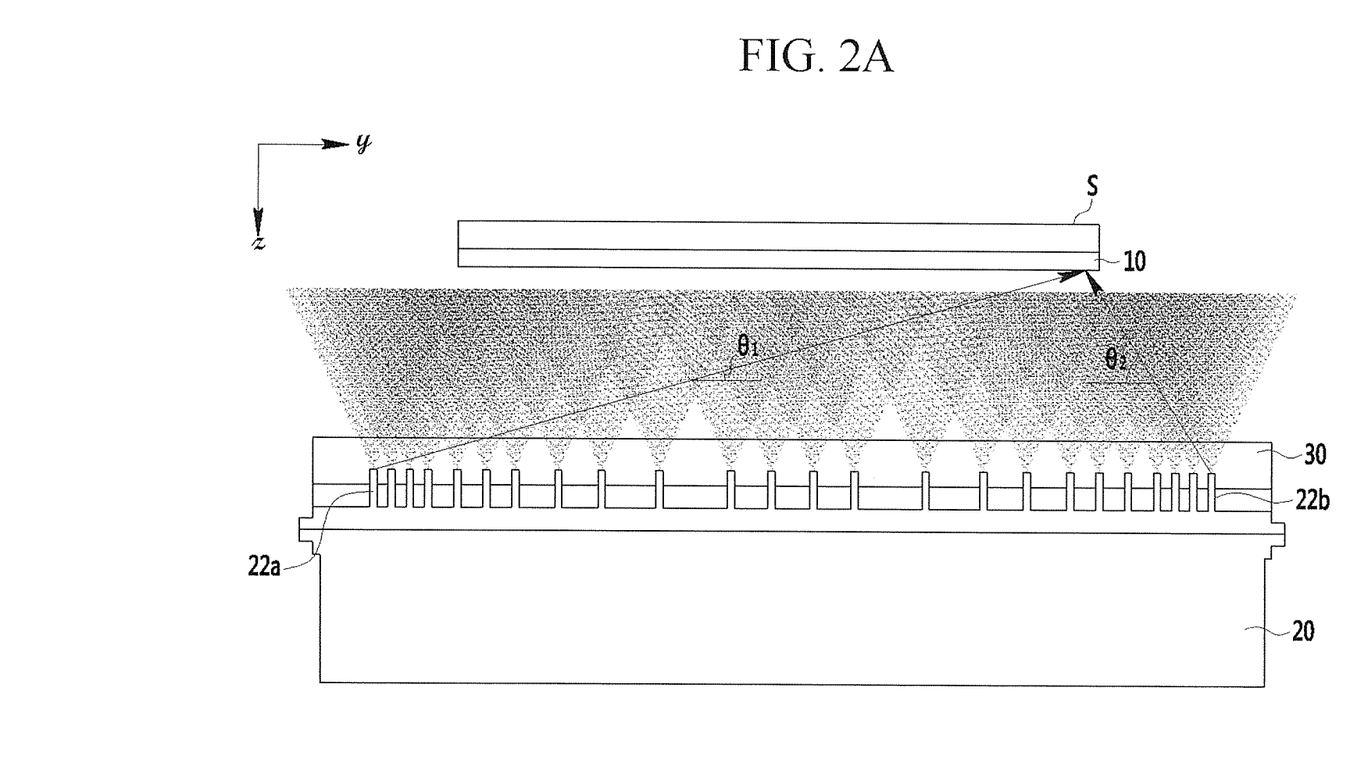
FIG. 2A and FIG. 2B are schematic views of a thin film deposition device for showing a process of forming an organic emission layer of an organic light emitting diode (OLED) display using a deposition mask according to an exemplary embodiment.
Figure 2B:
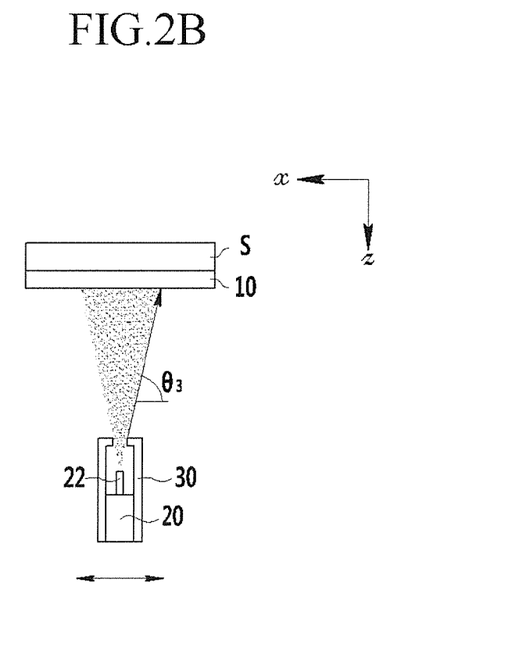

FIG. 2A and FIG. 2B are schematic views of a thin film deposition device for showing a process for forming an organic emission layer of an organic light emitting diode (OLED) display using a deposition mask according to an exemplary embodiment.

Referring to FIG. 2A and FIG. 2B, a thin film deposition device for depositing an organic layer including a thin film of an organic light emitting diode (OLED) display (e.g., an organic emission layer) by using a deposition mask 10, includes a deposition source 20 spraying the organic material inside a vacuum chamber (not shown), and a substrate (S) to be formed with the organic layer disposed to face the deposition source 20. Also, the deposition mask 10 is closely disposed between the deposition source 20 and the facing substrate (S). The deposition mask 10 is pulled through a magnet unit (not shown) applying a magnetic force such that the deposition mask 10 may be located close to the substrate (S) to be formed with the organic layer. The deposition source 20 may be a linear deposition source 20 in which spray nozzles 22 spraying the organic material are linearly arranged in a set or predetermined direction (e.g., y-axis direction). The linear deposition source 20 may spray the organic material on the substrate (S) while being moved in a direction (e.g., x-axis direction) intersecting a length direction thereof. Also, a pair of angle control members 30 formed at both sides along the length direction of the linear deposition source 20 and partially disposed on or blocking a discharging path of the organic material, may be provided to constantly control a spray angle in a width direction of the linear deposition source 20.

Figure 3:
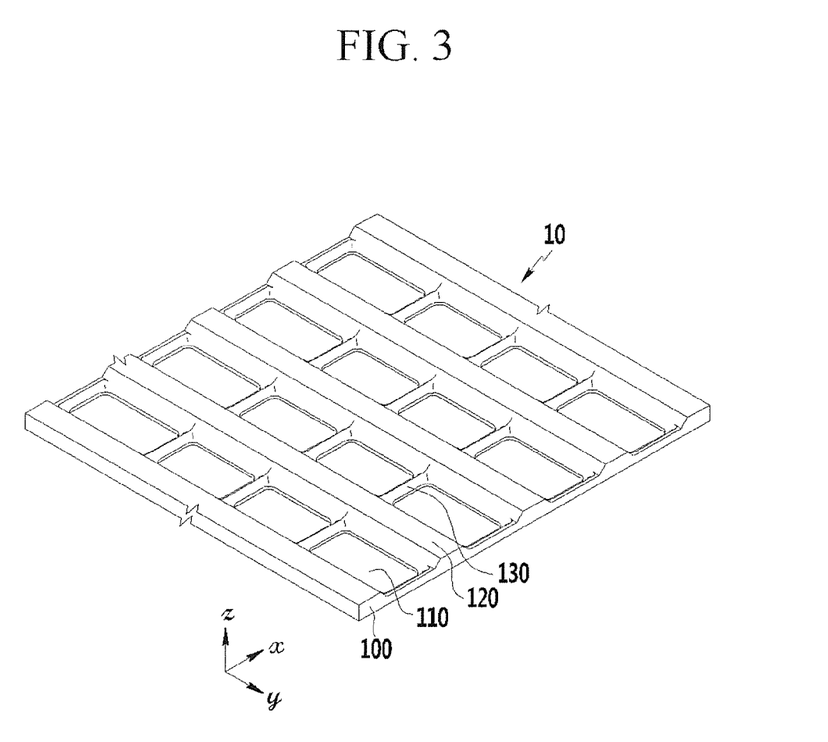
FIG. 3 is a perspective view of a deposition mask according to an exemplary embodiment.
Figure 4:
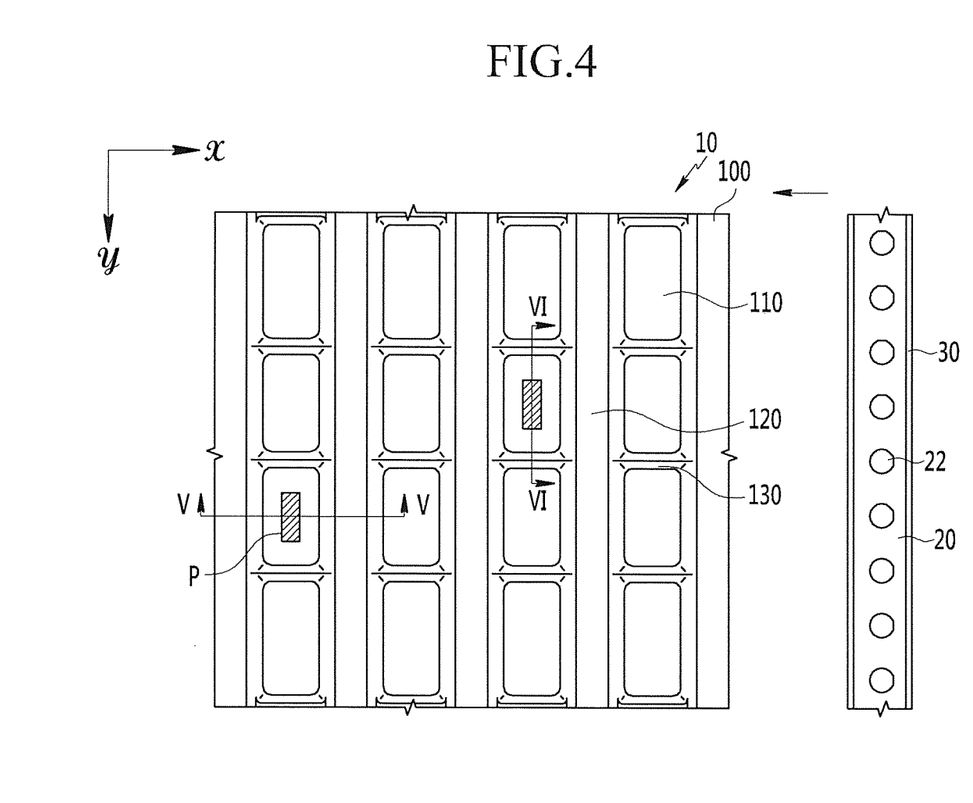
FIG. 4 is a plane view of a portion of a deposition mask according to an exemplary embodiment, as a schematic view of an arrangement of a deposition mask and a deposition source.

FIG. 3 is a perspective view of a deposition mask according to an exemplary embodiment, and FIG. 4 is a plane view of a portion of a deposition mask according to an exemplary embodiment, as a schematic view of an arrangement of a deposition mask and a deposition source.

Referring to the drawings, the deposition mask 10 according to an exemplary embodiment includes a base member 100 including a plurality of openings 110 formed to pass the deposition material to form the organic layer pattern (P).

The base member 100 may be formed of a plate shape having a set or predetermined thickness, and may be made of a material such that the deposition mask 10 may be pulled through magnetic force of the magnet unit to be close to the substrate (S). The base member 100 is formed of a mother mask corresponding to the entire size of the substrate (S), however it may be formed of a plurality of strip shapes disposed in parallel to be divided according to a set or predetermined direction. In the present exemplary embodiment, the base member 100 is realized by the mother mask type. However, it is not limited thereto, and the base member 100 may have the stripe shape and/or various shapes for forming the organic emission layer pattern.

Figure 5:
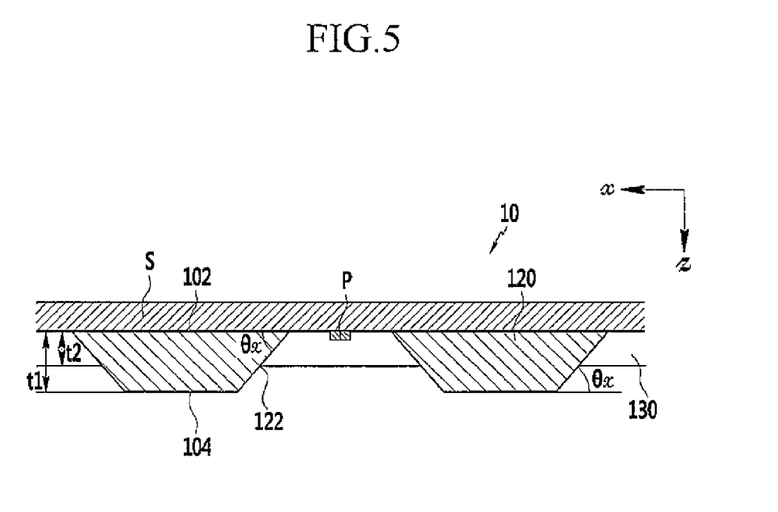
FIG. 5 is a cross-sectional view taken along the cutting line V-V of FIG. 4.

Referring to FIG. 5, when a surface of the base member 100 facing the substrate (S) of the organic light emitting diode (OLED) display is referred to as a first surface 102, and an opposite surface thereof is referred to as a second surface 104, the base member 100 includes a plurality of openings 110 (shown in FIGS. 3 and 4) passing through the first surface 102 and the second surface 104 in a thickness direction (e.g., z-axis direction) of the base member 100 to form the pattern (P) of the organic emission layer. The organic material sprayed from the deposition source 20 is deposited on the substrate (S) through the opening 110, thereby forming the organic layer. For example, the organic material for forming one emission layer among the R, G, and B emission layers of the subpixels of the unit pixel shown in FIG. 1 (e.g., the organic material for forming the R emission layer), is deposited on the substrate (S) through the opening 110, thereby forming the R emission layer. Also, as shown in FIG. 3 and FIG. 4, a plurality of openings 110 are arranged in a matrix format having a plurality of rows and columns, and the organic material pattern (P) may be deposited on the R emission layer included in each unit pixel.

The opening 110 is formed corresponding to the shape of the pattern (P) to be deposited, and at this time, the opening 110 in the present exemplary embodiment may have a rectangular shape that is rounded at the corners having a set or predetermined curvature. For the opening 110 of the rectangular shape, as shown in FIG. 4, a long edge is disposed to be parallel to the length direction (e.g., y-axis direction) of the linear deposition source 20, and the linear deposition source 20 sprays the organic material while being moved in the direction (e.g., x-axis direction) parallel to a short edge.

If the linear deposition source 20 and the opening 110 are disposed as described above, an angle control member 30 is provided in the moving direction (e.g., the x-axis direction) of the linear deposition source 20 as the angle control member in the direction as shown in FIG. 2B, thereby constantly maintaining an incident angle of the organic material sprayed from each spray nozzle 22 such that an angle formed by the incident direction of the organic material and the substrate may be constantly maintained as $\theta_3$.

However, a device such as an angle control member is not installed in the length direction (e.g., the y-axis direction) of the linear deposition source 20, and the length direction (e.g., the y-axis direction) is relatively longer than the width direction (e.g., the x-axis direction) such that it is difficult to uniformly maintain the incident angle of the organic material sprayed from each spray nozzle 22 in the length direction of the linear deposition source 20, like the width direction (e.g., the x-axis direction). For example, as shown in FIG. 2A, the angle between the incident direction and the substrate (S) when the organic material sprayed from a spray nozzle 22a disposed at the left end of the y-axis direction reaches the right end of the substrate (S), is at an angle $\theta_1$. However, the angle between the incident direction and the substrate (S) when the organic material sprayed from a spray nozzle 22b disposed at the right end of the y-axis direction reaches the right end of the substrate(S), is at an angle $\theta_2$. That is, the angle between the incident direction of the organic material and the substrate is changed according to the relative position between the spray nozzle 22 and the substrate (S). Here, the angle between the incident direction of the organic material sprayed from the spray nozzle 22 and the substrate, has a smallest value when the spray nozzle 22a spraying the organic material is farthest from the portion of the substrate that the organic material reaches.

Figure 6:
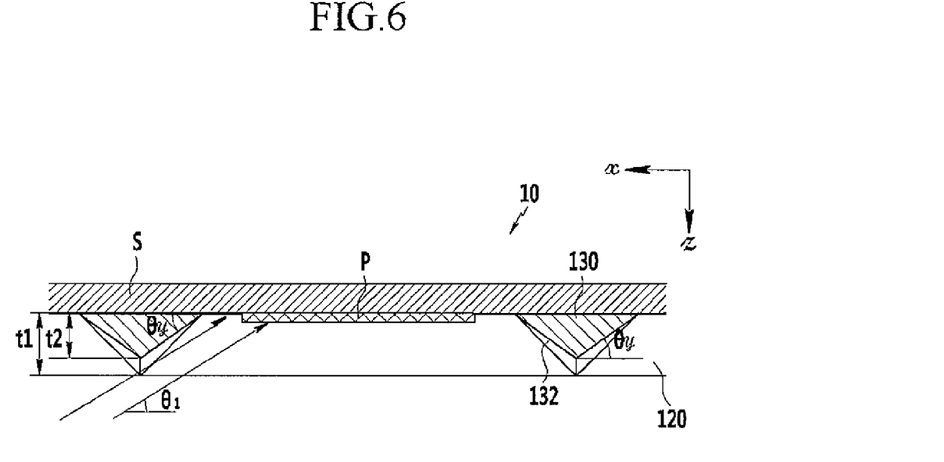
FIG. 6 is a cross-sectional view taken along the cutting line VI-VI of FIG. 4.

FIG. 5 is a cross-sectional view taken along the cutting line V-V of FIG. 4, and FIG. 6 is a cross-sectional view taken along the cutting line VI-VI of FIG. 4.

The opening 110 has a pair of first side walls 122 facing each other in the first direction (e.g., the x-axis direction) and a pair of second side walls 132 facing each other in the second direction (e.g., the y-axis direction) crossing the first direction. For example, when the opening 110 has the rectangular shape, the long edge may have the first side wall 122, and the short edge may have the second side wall 132.

The first side wall 122 and the second side wall 132 each have an inclination surface that is inclined with respect to the thickness direction (e.g., the z-axis direction) of the base member 100, and when measuring the inclination angle of the inclination surfaces with reference to the first surface 102 of the base member 100, the inclination angle ($\theta_x$) of the first side wall 122 and the inclination angle ($\theta_y$) of the second side wall 132 are different from each other. In one embodiment, the inclination angle ($\theta_x$) of the first side wall 122 along the direction of the long edge is larger than the inclination angle ($\theta_y$) of the second side wall 132. As described above, this is because the incident angle of the organic material sprayed from each spray nozzle 22 is substantially constant as the set or predetermined angle in the first direction (e.g., the x-axis direction) if the long edge of the opening 110 is disposed to be parallel to the length direction (e.g., the y-axis direction) of the linear deposition source 20. However, the incident angle of the sprayed organic material is not substantially constant in the second direction (e.g., the y-axis direction) but is smaller than the incident angle of the first direction (e.g., referring to FIG. 2A and FIG. 2B).

In several embodiments, the inclination angle ($\theta_y$) of the second side wall 132 is smaller than a minimum angle $\theta_1$ among the angles between the incident direction of the organic material sprayed from a plurality of spray nozzles 22 and the substrate (S). If the inclination angle ($\theta_y$) of the second side wall 132 is smaller than the minimum angle $\theta_1$, as shown in FIG. 6, although the sprayed organic material is incident with the minimum incident angle $\theta_1$, the organic material is not blocked by the height of the second side wall 132 and may be deposited at the desired location on the substrate (S). The deposition margin of the organic material may be reduced through this constitution and the generation of a shadow phenomenon may be prevented or reduced, and the space between the openings 110 may be reduced such that the aperture ratio of the organic light emitting diode (OLED) display may be increased. When considering the distance between the substrate (S) and the deposition source 20 and the incident angle of the organic material, the inclination angle ($\theta_x$) of the first side wall 122 is between about 45 degrees and about 60 degrees, and the inclination angle ($\theta_y$) of the second side wall 132 is between about 25 degrees and about 34 degrees.

The base member 100 may include a first bridge part 120 formed between the openings 110 adjacent in the first direction (e.g., x-axis direction) and dividing the adjacent openings 110, and a second bridge part 130 formed between the openings 110 adjacent in the second direction (e.g., y-axis direction) and dividing the adjacent openings 110.

As shown in FIGS. 5 and 6, the first bridge part 120 includes the first side wall 122, and the second bridge part 130 includes the second side wall 132. The cross-section of the first bridge part 120 may be formed with a trapezoid shape having the inclined first side wall 122 as the oblique edge, and the cross-section of the second bridge part 130 may be formed with a triangle shape having the second side wall 132 as the oblique edge. In one embodiment, the height of the first bridge part 120 is substantially the same as the thickness t1 of the base member 100, and the height t2 of the second bridge part 130 is less than the thickness t1 of the base member 100 (t1>t2). As described above, this is because the incident angle of the organic material sprayed from each spray nozzle 22 is substantially uniform in the first direction (e.g., the x-axis direction) as the set or predetermined angle if the long edge of the opening 110 is disposed to be parallel to the length direction (e.g., the y-axis direction) of the linear deposition source 20. However, the incident angle of the organic material is not uniform in the second direction (e.g., the y-axis direction) but is smaller than the incident angle of the first direction (e.g., the x-axis direction) (referring to FIG. 2A and FIG. 2B).

If the height t2 of the second bridge part 130 is lower than the thickness t1 of the base member 100, as shown in FIG. 6, even if the organic material is incident with the minimum incident angle $\theta_1$, the organic material is not blocked by the second bridge part 130 and may be deposited on the substrate (S). The deposition margin of the organic material may be reduced through this constitution and the generation of the shadow phenomenon may be prevented or reduced, and the space between the openings 110 may be reduced such that the aperture ratio of the organic light emitting diode (OLED) display may be increased.

When the openings 110 are arranged in the matrix format having the rows and columns respectively extending in the first direction and the second direction, the first bridge part 120 and the second bridge part 130 respectively formed between the openings 110 are also arranged in a plurality of rows and columns, as shown in FIG. 4.

Next, a manufacturing method of an organic light emitting diode (OLED) display according to an exemplary embodiment will be described with reference to the accompanying drawings.

The manufacturing method of the organic light emitting diode (OLED) display of the present exemplary embodiment may use the deposition mask 10 according to the present invention as described above.

The deposition mask 10 is aligned on the substrate S for the organic material to be deposited. The deposition mask 10 is the mask for forming the organic emission layer pattern (P), that is, one emission layer among the R, G, and B emission layers of the subpixel of the unit pixel of the organic light emitting diode (OLED) display, and the shape of the corresponding subpixel corresponds to the shape of the opening 110. As shown in FIG. 1, the R, G, and B subpixels of the unit pixel are each formed with the rectangular shape, and for the opening 110 formed with the rectangular shape as shown in FIG. 4, the opening 110 is disposed such that the long edge is disposed parallel to the length direction (e.g., the second direction or the y-axis direction) of the linear deposition source 20. Here, the opening 110 is disposed for the wide side to be toward the substrate (referring to FIG. 5 and FIG. 6).

As described, if the substrate (S), the deposition mask 10, and the linear deposition source 20 are disposed, the linear deposition source 20 sprays the organic material to be deposited through the spray nozzle 22 while being moved in the second direction (e.g., the x-axis direction) to form one organic emission layer pattern (P) among the R, G, and B subpixels on the substrate (S).

In one embodiment, the inclination angle ($\theta_y$) of the second side wall 132 is smaller than the minimum angle $\theta_1$ formed by the incident direction of the organic material sprayed from the plurality of spray nozzles 22 and the substrate (S). If the inclination angle ($\theta_y$) of the second side wall 132 is smaller than the minimum angle $\theta_1$, as shown in FIG. 6, even if the organic material is incident with the minimum angle $\theta_1$, the organic material is not blocked by the second bridge part 130 and may be deposited on the substrate (S).

In this process, the R emission layer is formed by using the deposition mask to form the R emission layer, the G emission layer is formed by using another deposition mask separated from this mask, and the B emission layer is formed by using another deposition mask, thereby realizing the unit pixel.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SOME SYMBOLS

10: deposition mask
100: base member
110: opening
120: first bridge part
130: second bridge part

What is claimed is:
1. A deposition mask for forming an organic layer pattern of an organic light emitting diode (OLED) display, comprising:
a base member having a first surface facing a substrate of the OLED display and a second surface facing opposite the first surface, and comprising a plurality of openings passing through the first surface and the second surface for forming the organic layer pattern, wherein each of the openings has a pair of first side walls facing each other in a first direction and a pair of second side walls facing each other in a second direction crossing the first direction, each side wall of the first side walls and the second side walls has an inclination surface inclined with respect to a thickness direction of the base member, and wherein an inclination angle of the inclination surface is measured with reference to the first surface of the base member, and the inclination angle of at least one of the first walls and the inclination angle of at least one of the second side walls are different from each other in each of the openings.

2. The deposition mask of claim 1, wherein the inclination angle of the first side wall is larger than the inclination angle of the second side wall.

3. The deposition mask of claim 2, wherein the inclination angle of the first side wall is between about 45 degrees and about 60 degrees, and the inclination angle of the second side wall is between about 25 degrees and about 34 degrees.

4. The deposition mask of claim 1, wherein the base member comprises:
   a first bridge part comprising the first side wall and formed between adjacent openings in the first direction; and
   a second bridge part comprising the second side wall and formed between the adjacent openings in the second direction,
   wherein a height of the first bridge part and a height of the second bridge part are different from each other.

5. The deposition mask of claim 4, wherein the height of the first bridge part is substantially the same as the thickness of the base member, and the height of the second bridge part is less than the thickness of the base member.

6. The deposition mask of claim 1, wherein the openings are arranged in a matrix format having rows in the first direction and columns in the second direction.

7. A method for manufacturing an organic light emitting diode (OLED) display including an organic layer, comprising:
   arranging a substrate of the OLED display to face a deposition source for spraying an organic material;
   arranging a deposition mask on the substrate, the deposition mask comprising a base member having a first surface facing the substrate and a second surface facing a side opposite the first surface, the base member having a plurality of openings passing through the first surface and the second surface for forming an organic layer pattern on the substrate, wherein each of the openings has a pair of first side walls facing each other in a first direction and a pair of second side walls facing each other in a second direction crossing the first direction, each side wall of the first side walls and the second side walls has an inclination surface that is inclined with respect to a thickness direction of the base member, and
   wherein an inclination angle of the inclination surface is measured with reference to the first surface of the base member, and the inclination angle of at least one of the first side walls and the inclination angle of at least one of the second side walls are different from each other; and
   forming the organic layer pattern on the substrate by spraying the organic material from a deposition source while the deposition source is moved relative to the substrate in the first direction.

8. The method of claim 7, wherein the inclination angle of the first side wall is larger than the inclination angle of the second side wall.

9. The method of claim 7, wherein the deposition source comprises a linear deposition source including a plurality of spray nozzles arranged in a direction parallel to the second direction.

10. The method of claim 7, wherein the inclination angle of the second side wall is smaller than a minimum angle among angles formed by an incident direction of the organic material sprayed from a plurality of spray nozzles and the substrate.

11. The method of claim 7, wherein the inclination angle of the first side wall is between about 45 degrees and about 60 degrees, and the inclination angle of the second side wall is between about 25 degrees and about 34 degrees.

12. A deposition mask for forming an organic layer pattern of an organic light emitting diode (OLED) display, comprising:
   a base member having a first surface facing a substrate of the OLED display and a second surface facing opposite the first surface, and comprising a plurality of openings passing through the first surface and the second surface for forming the organic layer pattern, a first bridge part having first side walls and being formed between adjacent openings in a first direction, and a second bridge part having second side walls and being formed between the adjacent openings in a second direction that crosses the first direction,
   wherein each of the openings is defined by a pair of the first side walls facing each other in the first direction and a pair of the second side walls facing each other in the second direction,
   each side wall of the first side walls and the second side walls has an inclination surface inclined with respect to a thickness direction of the base member, and
   wherein an inclination angle of the inclination surface is measured with reference to the first surface of the base member,
   the inclination angle of at least one of the first side walls and the inclination angle of at least one of the second side walls are different from each other, and
   wherein a height of the first bridge part and a height of the second bridge part are different from each other.

\* \* \* \* \*